(12) United States Patent
Matsuda

(10) Patent No.: US 7,423,221 B2
(45) Date of Patent: Sep. 9, 2008

(54) PRINTED WIRING BOARD AND FABRICATION METHOD FOR PRINTED WIRING BOARD

(75) Inventor: Yoshinari Matsuda, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/517,786

(22) Filed: Sep. 8, 2006

(65) Prior Publication Data

US 2007/0114057 A1 May 24, 2007

(30) Foreign Application Priority Data

Sep. 12, 2005 (JP) .......................... P2005-264156

(51) Int. Cl.
*H05K 1/16* (2006.01)
(52) U.S. Cl. ...................... 174/260; 361/760
(58) Field of Classification Search ................ 174/260; 324/158.1; 361/760
See application file for complete search history.

(56) References Cited

U.S. PATENT DOCUMENTS

| 5,897,326 | A * | 4/1999 | Eldridge et al. ............... 438/14 |
| 6,424,400 | B1 * | 7/2002 | Kawasaki .................... 349/149 |
| 6,608,259 | B1 * | 8/2003 | Norskov ..................... 174/261 |
| 2004/0112633 | A1 * | 6/2004 | Endo et al. .................. 174/255 |
| 2007/0114057 | A1 * | 5/2007 | Matsuda ..................... 174/260 |

FOREIGN PATENT DOCUMENTS

| DE | 10 2004 017455 | 3/2005 |
| JP | 2001-168506 | 6/2001 |
| JP | 2003-031937 A | 1/2003 |
| JP | 2003-249747 A | 9/2003 |
| JP | 2004-022793 | 1/2004 |

* cited by examiner

*Primary Examiner*—Dean A. Reichard
*Assistant Examiner*—Abiy Getachew
(74) *Attorney, Agent, or Firm*—Lerner, David, Littenberg, Krumholz & Mentlik, LLP

(57) ABSTRACT

A printed wiring board on which a pattern can be formed favorably by printing and soldering even where a small part of the 1005 size or less is mounted. The printed wiring board includes a substrate; a pair of soldering lands on the substrate, the soldering lands being spaced from one another with a first side of one land opposing a first side of another land; and a mounted part having a pair of electrodes on opposite ends thereof soldered to the respective lands. A wiring line is connected to each soldering land, and an insulating element overlies the wiring lines. The insulating element has openings formed so as to expose the soldering lands therethrough. Wiring line connection elements are individually connected to only the first sides of the lands. Each insulating element opening has an edge positioned outside of the corresponding land and on the inner side of the corresponding wiring line connection element.

6 Claims, 7 Drawing Sheets

PRINTED WIRING BOARD AND FABRICATION METHOD FOR PRINTED WIRING BOARD

CROSS-REFERENCE TO RELATED APPLICATIONS

The present application claims priority from Japanese Patent Application No. JP 2005-264156 filed on Sep. 12, 2005, the disclosure of which is hereby incorporated by reference herein.

BACKGROUND OF THE INVENTION

1. Field of the Invention

This invention relates to a printed wiring board for use to mount a surface mounted part and a fabrication method for a printed wiring board, and more particularly to a printed wiring board and a fabrication method for a printed wiring board suitably applied where patterns of wiring conductors and an insulating material are formed by printing.

2. Description of the Related Art

In recent years, together with reduction in scale and enhancement in function of electronic apparatus, also reduction in scale and increase in mounting density of a printed wiring board built in an electronic apparatus have and are being proceeded.

Also the main current of the size of parts (surface mounted parts) mounted on a printed wiring board is being changed from the 2012 size (2.0 mm long, 1.2 mm wide) or the 1608 size (1.6 mm long, 0.8 mm wide) to the 1005 size (1.00 mm long, 0.5 mm wide) or the 0603 size (0.6 mm long, 0.3 mm wide).

As reduction of the size of parts to be mounted decreases in this manner, also reduction in scale of conductor patterns of wiring lines and so forth and reduction in scale of pads (soldering lands) for soldering parts proceed.

Together with this, also the method of forming a conductor pattern for a wiring line or a solder resist pattern for a surface protective film or the like on a printed wiring board is changing. In particular, the method is changing from a printing method by screen printing which has been used popularly to a photolithography method by which a finer pattern can be formed.

According to the printing method by screen printing, an error of approximately 0.1 mm remains after formation of a pattern. On the other hand, according to the photolithography method, the error after pattern formation can be reduced to ±0.05 mm or less, and therefore, a finer pattern can be formed.

A process of forming solder resist on a printed circuit board by a printing method by screen printing is performed in the following manner.

First, a silk screen on which a pattern of solder resist is formed is used to perform screen printing on a printed wiring board on which a conductor pattern is formed to print ink of the solder resist on the printed circuit board.

Then, irradiation of ultraviolet (UV) rays or heating is performed for the printed wiring board on which the pattern is printed to harden the ink of the solder resist.

Where a pattern of solder resist on a printed wiring board is formed by a printing method as described above, in order to eliminate a possible influence of the error after pattern formation described above, the following countermeasure is taken frequently. In particular, an opening of solder resist to be formed on a soldering land is designed so as to have an area greater or smaller than that of the soldering land in advance. The countermeasure described is disclosed, for example, in Japanese Patent Laid-Open No. 2003-249747 or Japanese Patent Laid-Open No. 2003-31937.

Exemplary patterns of a printed wiring board where a surface mounted part on the printed wiring board is mounted are shown in FIGS. 10A and 10B.

Referring to FIGS. 10A and 10B, a conductor pattern 52 including a wiring line is connected to a soldering land 51, and a pattern of solder resist 54 is formed leaving an opening 53.

In FIGS. 10A and 10B, the opening 53 of the solder resist 54 is designed so as to have an area greater than that of the soldering land 51.

Therefore, a portion (exposed portion) 52a of the conductor pattern 52 is exposed through the opening 53.

The size of the exposed portion 52a of the conductor pattern 52 which forms a wiring line differs depending upon the connection position of the conductor pattern 52 to the soldering land 51, the number of such connection locations, the width of the wiring line and so forth.

Where the part to be mounted is large, even if the size of the exposed portion 52a of the conductor pattern 52 has a dispersion, this does not make any problem. The limit to the error range in the printing method is approximately 0.1 mm as described hereinabove. Since a soldering land on which a part of the 2012 size is to be mounted has a size of 1.2 mm to 1.4 mm, even the printing method can be used to form the soldering land without any problem.

In contrast, a soldering land for mounting a part of the 1005 size has such a small side as approximately 0.6 mm. Therefore, there is the possibility that the pattern error of 0.1 mm by a printing method may have a bad influence on the quality of soldering.

On the other hand, where the opening of solder resist is designed so as to have an area smaller than that of the soldering land, the solder resist covers also an end edge of the soldering land.

If a soldering land is designed in this manner and formed by a printing method, then the ink of the solder resist is likely to suffer from blurring also from an influence of an offset by the soldering land.

Further, since the mesh of the silk screen is as coarse as #100 to #170, the opening of the solder resist after printed does not exhibit a linear contour and the solder resist is likely to partly blur.

Since a soldering land for mounting a part of the 1005 size has a size as small as approximately 0.6 mm as described hereinabove, there is the possibility that appearance of such blurring as described above may have a bad influence on the quality of soldering.

Thus, if the photolithography method is adopted to form a pattern of solder resist, then since the pattern error can be reduced to 0.05 mm or less, also mounting of a small-sized part is permitted.

Therefore, where a small part of the 1005 size or the 0603 size is to be mounted, the photolithography method is usually used to form a conductor pattern or a pattern of solder resist on a printed wiring board.

However, the photolithography method has a drawback in that it involves a greater number of processing steps than and is inferior in productivity to the printing method.

Therefore, where the photolithography method is used to form a pattern, a high production cost is needed for a printed wiring board.

Further, since parts of the 1005 size are recently used in a mass, the price of parts of the 1005 size drops to such a degree that they can be acquired at a lower price than parts of the 2012 size or the 1608 size.

Therefore, if the photolithography method is used to form a pattern in a popular manner on a printed wiring board for mounted parts of the 1005 size, then since it takes a high production cost, the low price of the parts is less likely to be reflected on the price of an electronic apparatus in which the parts are mounted on the printed wiring board.

Therefore, it is demanded to use a printing method by which a pattern can be formed at a comparatively low production cost also on a printed wiring board on which parts of the 1005 size are to be mounted.

In order to solve the problem described above, an embodiment of the present invention provides a printed wiring board and a production method for a printed wiring board on and by which a pattern can be formed using a printing method and soldering can be performed favorably even where a small part of the 1005 size or less is to be mounted.

SUMMARY OF THE INVENTION

According to the embodiment of the present invention, there is provided a printed wiring board including a substrate; a pair of pads formed on the substrate, the pads being spaced from one another with a first side of one pad opposing a first side of another pad; a mounted part having a pair of electrodes on opposite ends thereof, each electrode being soldered to a respective one of the pads; a wiring line connected to each of the pads; an insulating element configured to overlie the wiring lines, the insulating element having openings formed therein such that the pads are exposed through the openings; a pair of wiring line connection elements individually connected to only the first sides of the pads through the wiring line connection elements; each of the openings having an edge positioned, except for the first sides of the pads, outside of the corresponding pad and on an inner side of the corresponding wiring line connection element.

In the embodiment of the present invention, since the printed wiring board has the configuration described above, the wiring lines are individually connected to the pads through the wiring line connection elements. Therefore, the wiring lines are prevented from being exposed through the openings of the insulating elements or the like. Consequently, the size of a region in which conductor patterns including the wiring lines are exposed does not differ depending upon the difference in the connection position, number, width and so forth of the wiring lines. Therefore, the influence on the soldering state can be suppressed.

Further, each of the openings is formed such that it has an edge which is positioned, except for the sides of the pads which are opposed to each other, outside of the corresponding pad and on an inner side of the corresponding wiring line connection element. Therefore, even if displacement occurs with the pattern of the insulating element or the like when the printed wiring board is fabricated, the pads can be exposed up to end edges thereof through the openings.

Consequently, occurrence of such blurring as described above is prevented, and therefore, the influence of displacement of the pattern on the soldering state can be suppressed.

Accordingly, a surface mounted part of a small size can be attached to the printed wiring board without being influenced by the error of the pattern of the insulating element or the like which is caused by a printing method.

With the printed wiring board according to the embodiment of the present invention, even if an error occurs with the pattern of the insulating element or the like, the influence to be had on mounting can be eliminated. Consequently, the accuracy of the pattern of the insulating element or the like can be lowered.

Accordingly, even where the printed wiring board is used together with a mounted part of a size smaller than the 1005 size, the pattern of the insulating element or the like can be formed by a printing method which is not so expensive.

The above features and advantages of the embodiment of the present invention will become apparent from the following description and the appended claims, taken in conjunction with the accompanying drawings in which like parts or elements denoted by like reference symbols.

DETAILED DESCRIPTION

Figure 1:
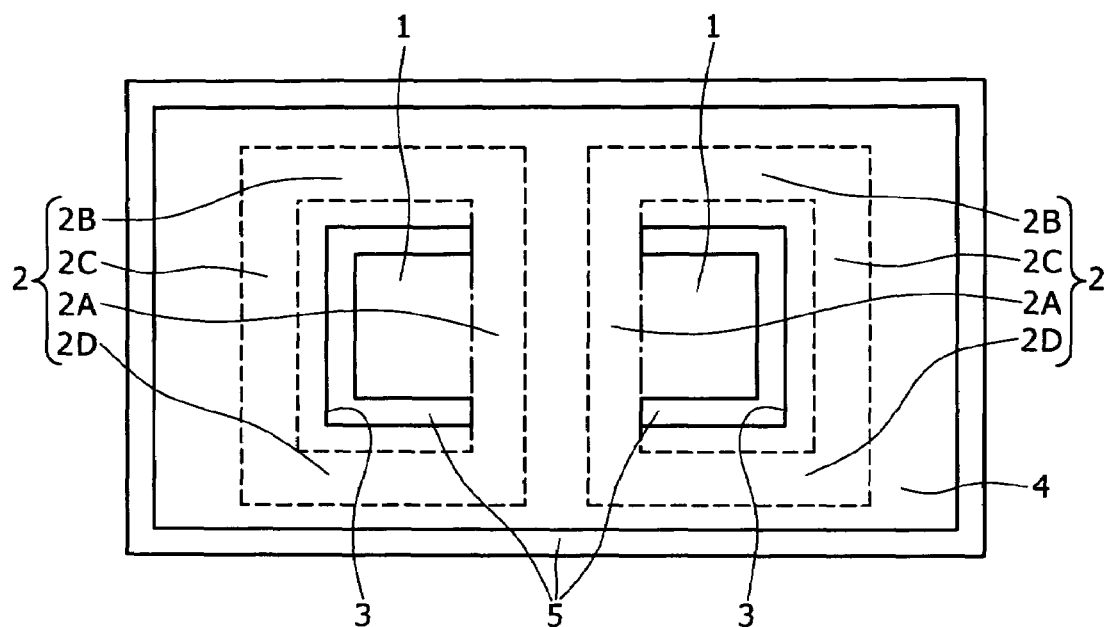
FIG. 1 is a plan view of a printed wiring board to which the embodiment of the present invention is applied.

A plan view of a printed wiring board to which the embodiment of the present invention is applied is shown in FIG. 1. Meanwhile, a plan view of conductor pattern of the printed wiring board of FIG. 1 is shown in FIG. 2.

Figure 2:
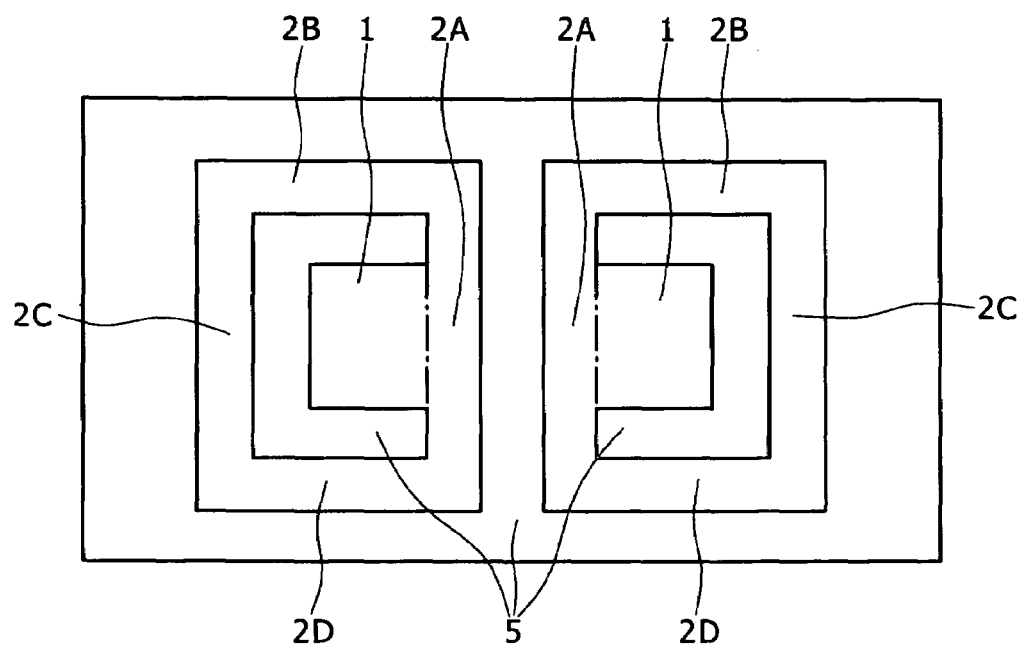
FIG. 2 is a plan view showing conductor patterns of the printed wiring board of FIG. 1.

Referring to FIGS. 1 and 2, the printed wiring board having a circuit board 5 on which conductor patterns each including a soldering land 1 which is a pad for mounting a part and solder resist 4 having openings 3 above the soldering lands 1 are formed.

The soldering lands 1 are disposed in an opposing relationship to each other so as to mount a surface mounted part which has a pair of electrodes on the opposite ends thereof.

In the printed wiring board of the embodiment of the present embodiment, particularly each of the conductor patterns has a wiring line connection element 2 (2A, 2B, 2C and 2D) which is shaped so as to surround the corresponding soldering land 1. Wiring lines are connected to the wiring line connection elements 2 (2A, 2B, 2C and 2D) as hereinafter described.

Of the wiring line connection elements 2, the portions 2A on the side on which the soldering lands 1 are opposed to each other are connected individually to the soldering lands 1.

The other portions 2B, 2C and 2D of the wiring line connection elements 2 of the conductor patterns are spaced away from the soldering lands 1.

Further, the soldering lands 1 are exposed individually through the openings 3 of the solder resist 4.

Meanwhile, the wiring line connection elements 2 are covered entirely with the solder resist 4.

Since the wiring line connection elements 2 are provided so as to surround the soldering lands 1 and be connected to the soldering lands 1 only on the side of the soldering lands 1 which are opposed to each other, where the pattern of the solder resist 4 is displaced out of position, the influence of this to be had on mounting can be suppressed.

This makes it possible to use a printing method to form a pattern of the solder resist 4 and so forth.

Figure 3:
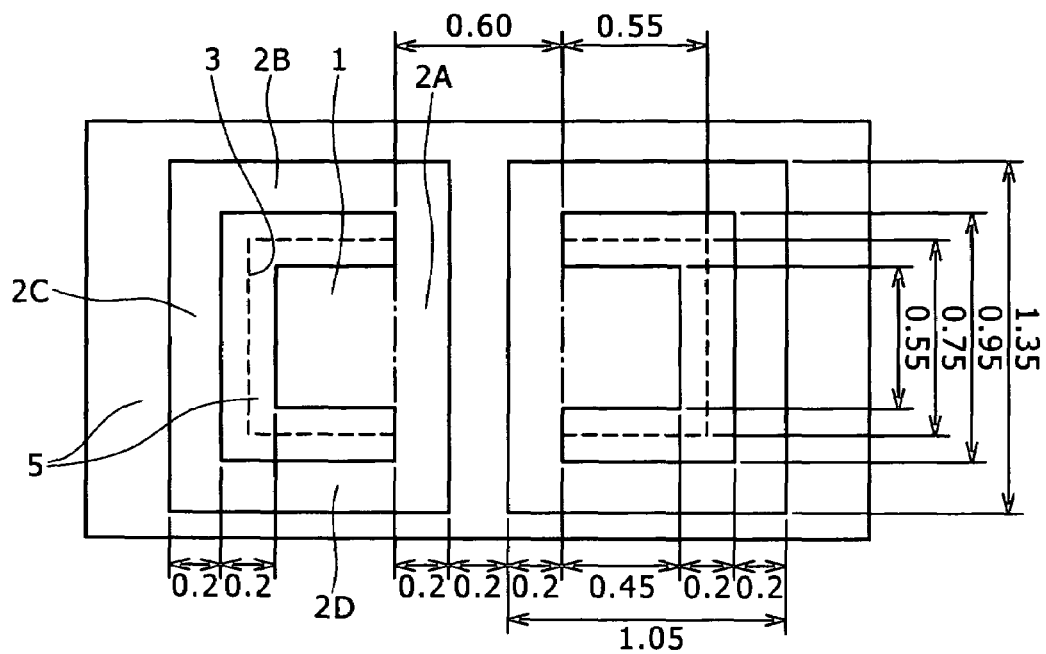
FIG. 3 is a schematic view showing an example of the dimension of different locations of the conductor patterns of FIG. 2 where a surface mounted part of the 1005 size is to be mounted.

An example of the dimension of various portions of the conductor patterns where the printed wiring board of FIG. 1 is applied as a printed wiring board on which a surface mounted part of the 1005 size is to be soldered is shown in FIG. 3. It is to be noted that each of the openings 3 of the solder resist 4 is indicated by a broken line while the other portions are indicated in a similar manner as in FIG. 2.

In the dimension example shown in FIG. 3, the line/space which are limits to the resolution where the pattern of the solder resist 4 is formed by a printing method are designed to line/space=0.2 mm/0.2 mm.

The size of the soldering lands 1 is 0.45 mm wide and 0.55 mm long, and the distance between the opposing soldering lands 1 is 0.6 mm. The width of the wiring line connection elements 2 is 0.2 mm.

The space between the wiring line collection elements 2 and the soldering lands 1 is set to 0.2 mm taking ±0.1 mm of the pattern error by a printing method into consideration.

The wiring line connection elements 2 have a rather elongated shape of 1.05 mm wide and 1.35 mm long. The openings 3 of the solder resist 4 is 0.55 mm wide and 0.75 mm long.

In the present dimension example, each of the openings of the solder resist 4 has an edge positioned at the center of the space between the wiring line connection element 2 and the soldering land 1.

Then, a printed wiring board is designed such that it has such dimensions as indicated in FIG. 3 and has the configuration described hereinabove with reference to FIGS. 1 and 2. Then, a printed wiring board is fabricated in accordance with the design.

The printed wiring board of the present embodiment described above with reference to FIGS. 1 and 2 can be fabricated in the following manner. The fabrication method described below utilizes a printing method to form the conductor patterns and the pattern of the solder resist 4.

First, the conductor patterns including the soldering lands 1, wiring line connection elements 2 (2A, 2B, 2C and 2D) and wiring lines are formed on the circuit board 5.

In this instance, although only the shape of the conductor patterns is different, the conductor patterns can be formed quite similarly as in a common formation method of a conductor pattern on a printed wiring board.

For example, etching resist is applied to portions of a copper clad laminate which correspond to the conductor patterns to be formed.

Then, etchant such as ferric chloride solution, cupric chloride solution or alkali etchant is used to dissolve and remove the copper foil.

Then, the etching resist which is no more necessary is stripped using stripping agent such as organic solvent or alkaline developer.

Thereafter, the circuit board 5 is washed with water and dried.

The conductor patterns are formed in this manner.

Thereafter, the solder resist 4 is formed on the conductor patterns by a printing method.

In this instance, the solder resist 4 can be formed similarly by a common method of formation of the solder resist 4 on a printed wiring board.

Then, a screen printing method by a silk screen on which a pattern of solder resist is formed is used to print ink of solder resist on the circuit board 5 on which the conductor patterns are formed to form the pattern of the solder resist 4 on the circuit board 5.

Then, the ink of the solder resist is dried by UV (ultraviolet rays) irradiation or heating.

The solder resist 4 of the predetermined pattern having the openings 3 can be formed in this manner.

Since the solder resist 4 is formed by a printing method in this manner, the pattern of the solder resist 4 sometimes suffers from displacement of approximately ±0.1 mm.

Figure 4:
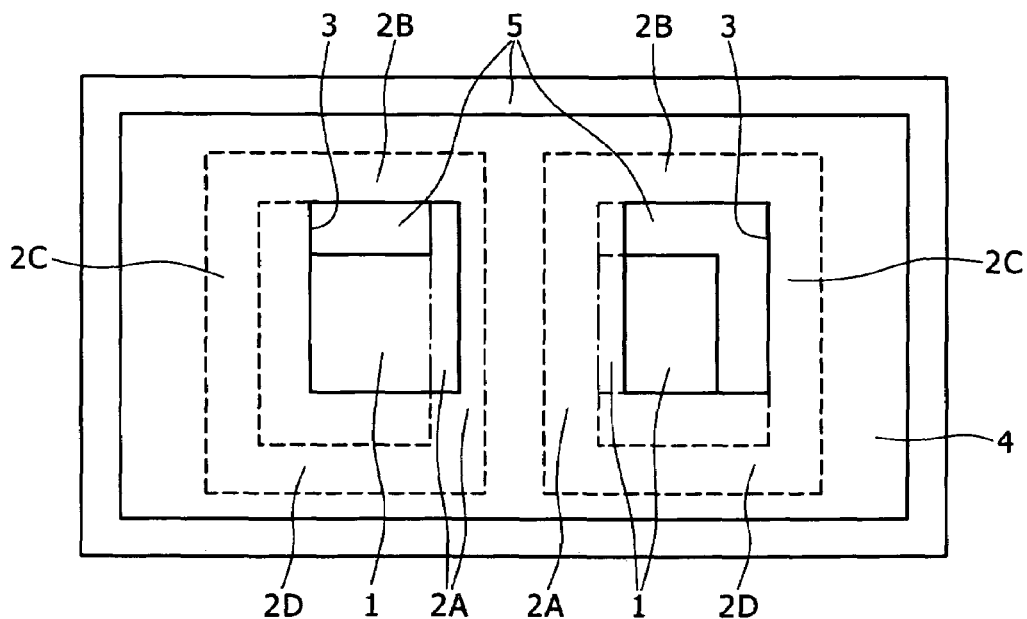
FIG. 4 is a plan view of the printed wiring board of FIG. 1 where solder resist patterns shown in FIG. 3 are displaced by 0.1 mm.

The pattern of the solder resist 4 where it is displaced from the designed positional relationship shown in FIGS. 1 and 3 is shown in FIG. 4. In particular, FIG. 4 illustrates the pattern of the solder resist 4 where it is displaced by 0.1 mm in both of the rightward direction and the upward direction with respect to the conductor patterns.

Referring to FIG. 4, the right side soldering land 1 is partially hidden, at a left side portion thereof at which the soldering land 1 contacts with the corresponding wiring line connection element 2, by the solder resist 4.

On the other hand, the left side soldering land 1 is exposed, at a portion of the portion 2A of the wiring line connection element 2 which is opposed to the soldering land 1, through the opening 3.

In this manner, the areas over which the soldering lands 1 and the wiring line connection element 2 are exposed on the left and the right are different from each other.

However, an influence which is actually had on the soldering state appears on the sides (upper and lower sides and remote side of the soldering lands 1) other than the opposing side of the soldering lands 1.

When a mounted part is to be connected after solder is applied by printing to the soldering lands 1, the mounted part is moved downwardly by the pressing force from a mounter and the weight of the mounted part. Also when the solder is melted by reflow, the mounted part is moved downwardly by its weight. Therefore, the molten solder is pushed out onto the soldering lands 1 on the outer sides of the mounted part.

Since the solder is pushed out onto the soldering lands 1 on the outer sides of the mounted part, the amount of the solder on the inner side of the mounted part becomes smaller than that on the outer sides of the mounted part. Therefore, even if the pattern of the solder resist 4 is displaced by approximately 0.1 mm, the influence on the mounting is very little.

In contrast, on the outer sides of the mounted part, the area of the soldering lands 1 and the amount of the solder applied to the soldering lands 1 have a significant influence on the mounting of the mounted part.

Further, in the printed wiring board of the present embodiment, even if the pattern of the solder resist 4 is displaced as seen in FIG. 4, on the upper and lower sides of the soldering lands 1 and the remote side of the soldering lands 1, the board 5 is exposed through the openings 3 of the solder resist 4 to the remote edges of the soldering lands 1.

In other words, it can be recognized that, with the printed wiring board of the present embodiment, the soldering state is not influenced by displacement in printing of the pattern of the solder resist 4.

Further, even if the pattern of the solder resist 4 is displaced by 0.1 mm in another direction from the designed position, the soldering state is not influenced by displacement in printing similarly.

In the present embodiment, since the direction and the connection position of the wiring lines to be connected to the wiring line connection elements 2 do not have an influence which may be had on the soldering state in the case of a popular printed wiring board, they can be set comparatively freely.

However, the portions 2A of the wiring line connection elements 2 on the side on which the soldering lands 1 are opposed to each other have little area for connection of a wiring line. Therefore, the wiring line connection elements 2 are connected at the other portion 2B, 2C or 2D or at the upper and lower ends of the portion 2A to wiring lines.

Figure 5:
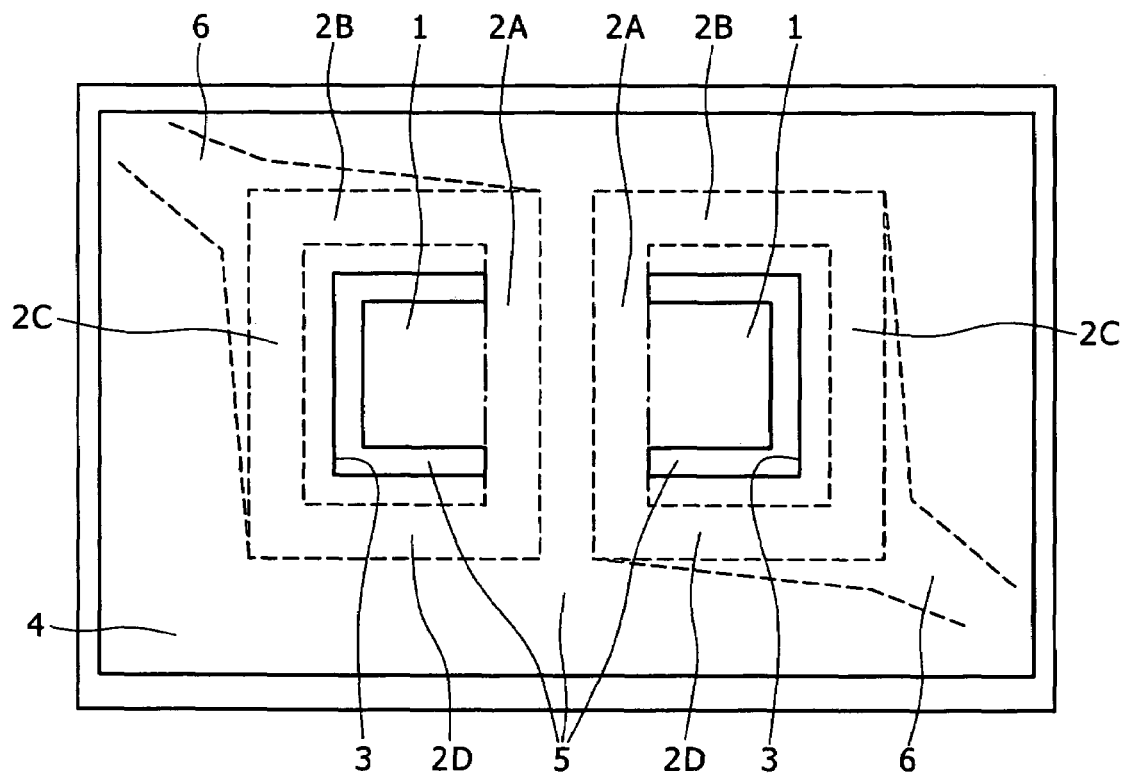
FIG. 5 is a plan view of the printed wiring board of FIG. 1 where a wiring line is connected to a wiring line connection element shown in FIG. 1.

A form of a connection state of wiring lines to the wiring line connection elements 2 is shown in plan in FIG. 5.

Referring to FIG. 5, on the left side half of the printed wiring board, a wiring line 6 is connected to a left upper corner of the left side wiring line connection element 2.

Meanwhile, on the right side half of the printed wiring board, another wiring line 6 is connected to a right lower corner of the right side wiring line connection element 2.

As seen in FIG. 5, each of the wiring lines 6 is not directly connected to the corresponding soldering land 1, but connected to the soldering land 1 through the corresponding wiring line connection element 2 which is formed around the soldering land 1. Consequently, even if the soldering land 1 is small in size because of use of a mounted part of a small size, the width, direction and connection position of wiring lines can be designed freely without having an influence on the soldering state.

Figure 6A:
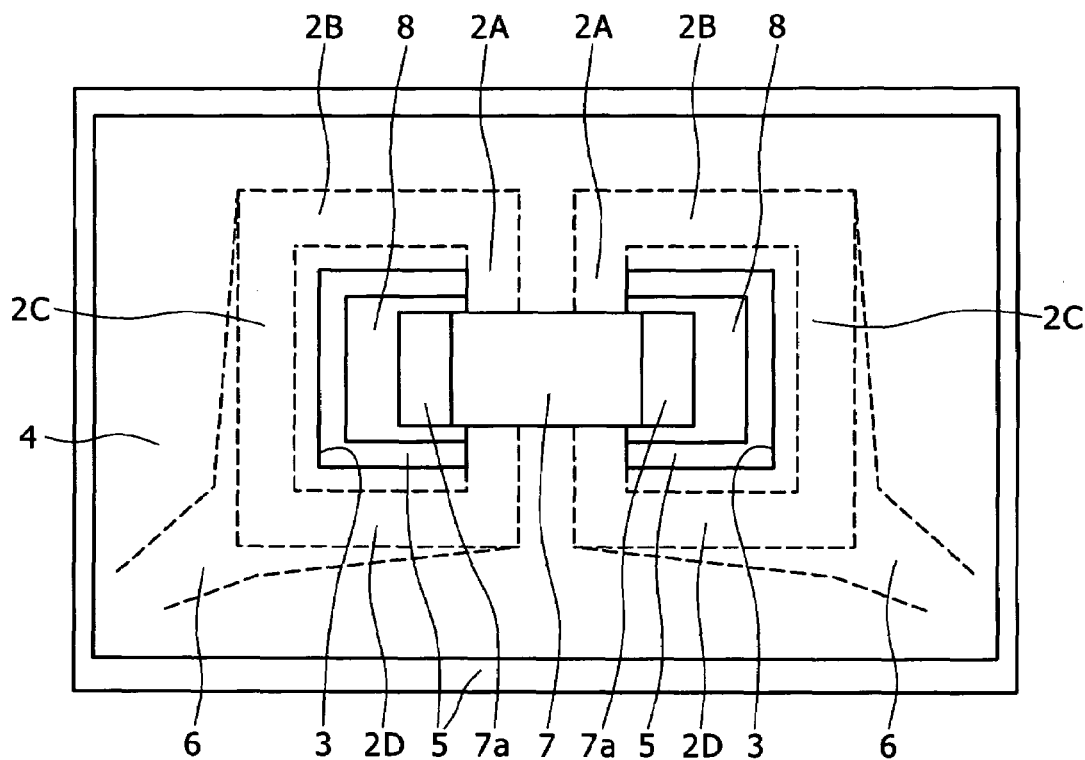
FIG. 6A is a plan view of the printed wiring board shown in FIG. 5 on which a mounted part is attached.
Figure 6B:
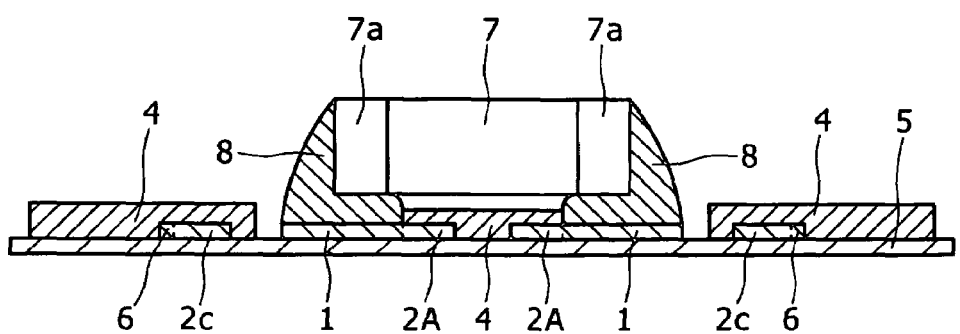
FIG. 6B is a sectional view taken along an alternate long and two short dashes line of FIG. 6A.

The printed wiring board of FIG. 5 on which a mounted part is mounted is shown in FIGS. 6A and 6B.

FIG. 6A is a plan view where a mounted part 7 is attached to the printed wiring board shown in FIG. 5, and FIG. 6B is a sectional view taken along an alternate long and two short dashes line of FIG. 6A.

As seen from FIGS. 6A and 6B, the mounted part 7 is connected to the soldering lands 1 through respective fillets 8.

The mounted part 7 has a pair of electrodes 7a at the opposite ends thereof and connected at the electrodes 7a thereof to the solder applied to the soldering lands 1.

The attachment of the mounted part 7 to the printed wiring board is performed by a reflow system similarly as in a usual method.

For example, screen printing on the soldering lands 1 is performed using a metal mask or the like such that a fixed amount of cream solder (mixture of powder of solder alloy and resin or a like substance which has viscosity) is applied to the soldering lands 1 through openings of the metal mask.

Then, the mounted part 7 is mounted on the cream solder applied to the soldering lands 1 using a chip mounter or the like. Since the cream solder contains viscous resin, the mounted part 7 mounted in this manner is secured to the cream solder.

Thereafter, the solder of the circuit board 5 on which the mounted part 7 is mounted is heated and melted in a reflow furnace so that the electrodes 7a of the mounted part 7 are wet with the solder. Thereafter, the solder is cooled and hardened to form the fillets 8 by which the mounted part 7 is attached to the surface of the printed wiring board.

As can be seen from FIG. 6B, the amount of the solder existing under the electrodes 7a of the mounted part 7 is very small when compared with the amount of the solder existing on the outer side of the mounted part 7. Accordingly, the area on the inner sides of the mounted part and the amount of applied solder have little influence on the mounting even if the pattern of the solder resist 4 is displaced.

According to the configuration of the printed wiring board of the present embodiment, it has a wiring line connection element 2 (2A, 2B, 2C and 2D) shaped so as to surround the corresponding soldering land 1, and a wiring line 6 is connected to the soldering land 1 through the wiring line connection element 2.

Consequently, the magnitude of exposed regions of the conductor patterns is kept fixed irrespective of the connection position, the connection number, the width and so forth of the wiring lines.

Further, when the solder resist 4 having the openings 3 is formed on the soldering lands 1 by a printing method, even if the pattern of the solder resist 4 is displaced, on the upper and lower sides and remote side of the soldering lands 1 which have an influence on the soldering state, the board 5 is exposed up to the end edge of the soldering lands through the openings 3.

Accordingly, the influence of the displacement of the pattern of the solder resist 4 to be had on the soldering state can be suppressed.

Then, even if the soldering lands 1 have a reduced size because of use of a mounted part of a smaller size, the width, direction and connection position of the wiring lines can be designed freely without having an influence on the soldering state. Therefore, even where a mounted part of such a small size as the 1005 size is to be connected, a printing method can be used for pattern formation on the printed wiring board.

Where a printing method is used for pattern formation on a printed wiring board in this manner, the number of steps is reduced and the productivity is improved when compared with an alternative case wherein a photographic method is used for pattern formation.

Accordingly, the production cost of the printed wiring board can be reduced significantly.

In the embodiment described above, the wiring line connection elements 2 (2A, 2B, 2C and 2D) having a framework shape are formed in such a manner as to individually surround the soldering lands 1. However, according to the present invention, various other shapes can be applied to the wiring line connection elements for interconnecting soldering lands and wiring lines.

Figure 7:
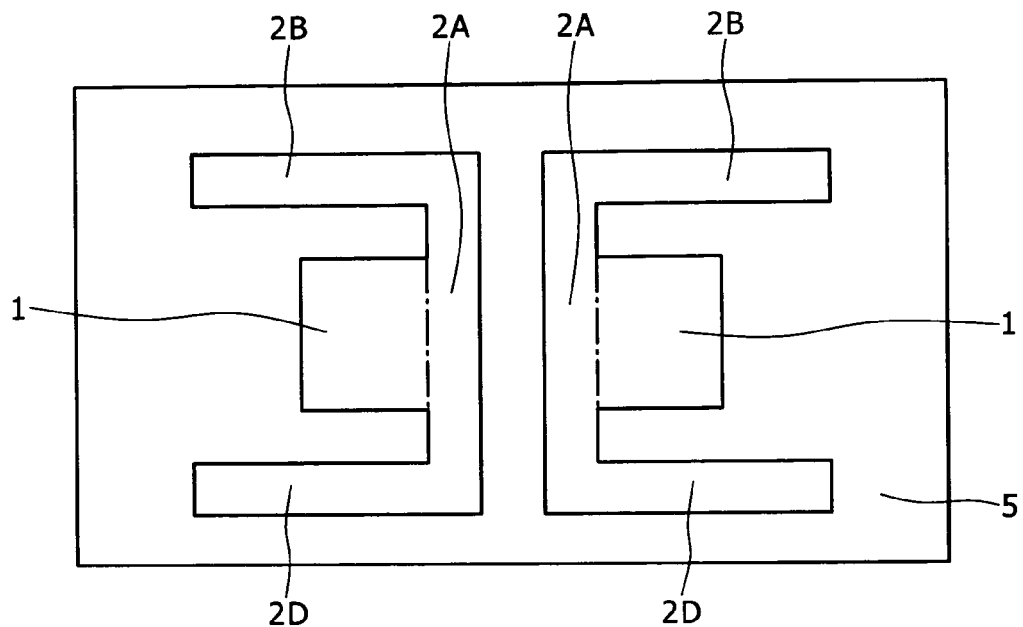
FIG. 7 is a plan view showing conductor patterns on another printed wiring board to which the embodiment of the present invention is applied.

A conductor pattern of another printed wiring board to which the present invention is applied is shown in plan in FIG. 7.

Referring to FIG. 7, the printed wiring board shown has a configuration similar to that of the printed wiring board described hereinabove with reference to FIG. 1 except the following point.

In particular, each of the wiring line connection elements 2 includes a portion 2A on the side on which the soldering lands 1 are opposed to each other, a portion 2B on the upper side in FIG. 7 and a portion 2D on the lower side in FIG. 7 and is generally formed in a channel shape.

Thus, the wiring line connection element 2 is equivalent to that of the printed wiring board of the embodiment described hereinabove with reference to FIG. 1 which does not have the portion 2C on the remote side of the soldering land 1.

Also where the printed wiring board has such a configuration as described above, even if displacement occurs with the pattern of the solder resist 4, this can be prevented from having an influence on the soldering state of a mounted part similarly as in the printed wiring board of the embodiment described above. Therefore, the pattern of the solder resist 4 can be formed by a printing method thereby to reduce the production cost of the printed wiring board significantly.

It is to be noted that, in the printed wiring board of the present embodiment, the length of the upper side portion 2B and the lower side portion 2D in FIG. 7 of the wiring line connection elements 2 is not restricted specifically. In particular, the length may be greater than that of the soldering lands 1 as seen in FIG. 7, or may otherwise be equal to or smaller than that of the soldering lands 1.

Where the portions 2B and 2D are formed longer as seen in FIG. 7, there is an advantage that, since each portion to which a wiring line is to be connected is comparatively long, the degree of freedom in design of a wiring line scheme is high.

Figure 8:
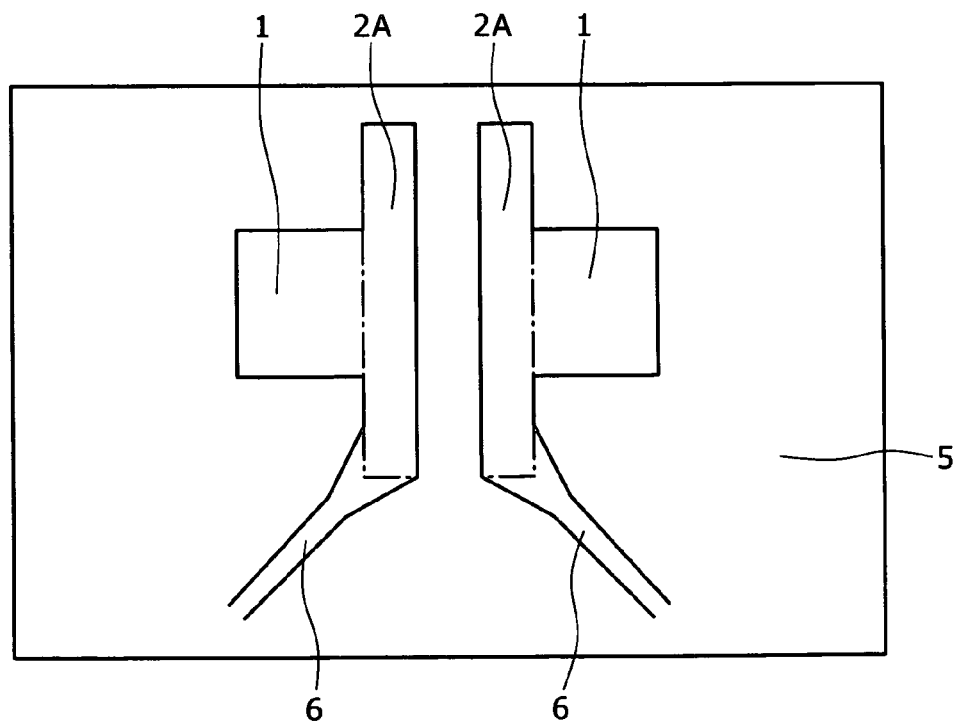
FIG. 8 is a plan view showing conductor patterns on a further printed wiring board to which the embodiment of the present invention is applied.
Figure 9:
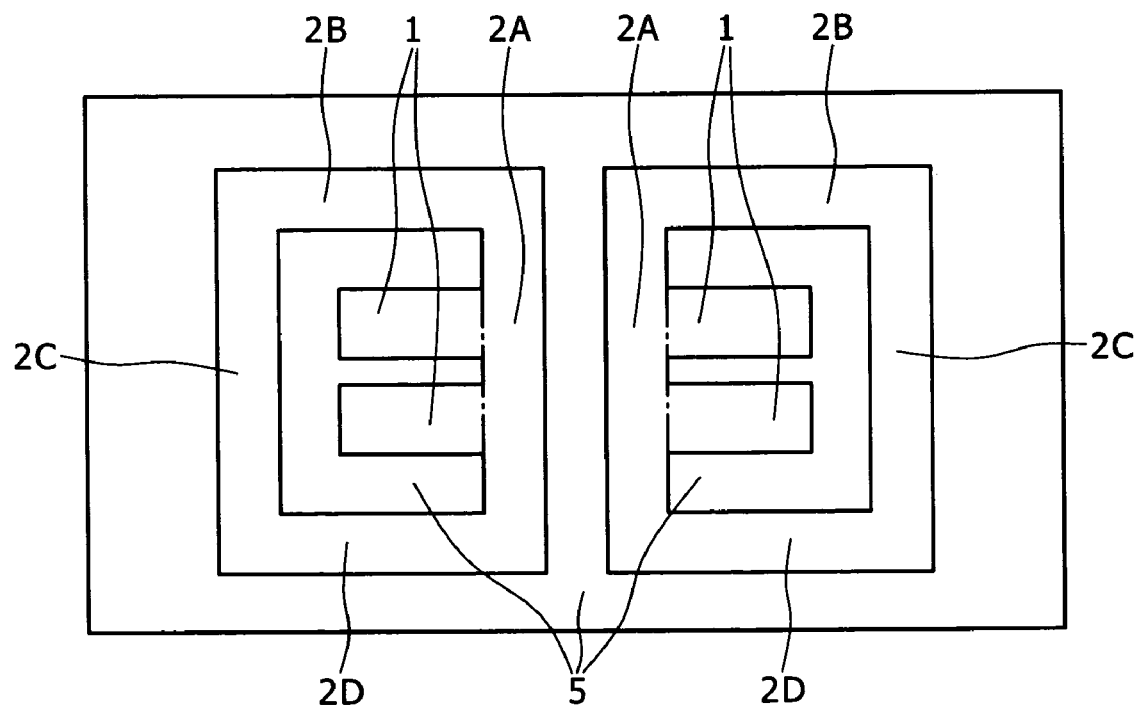
FIG. 9 is a plan view showing conductor patterns on a still further printed wiring board to which the embodiment of the present invention is applied.
Figure 10A:
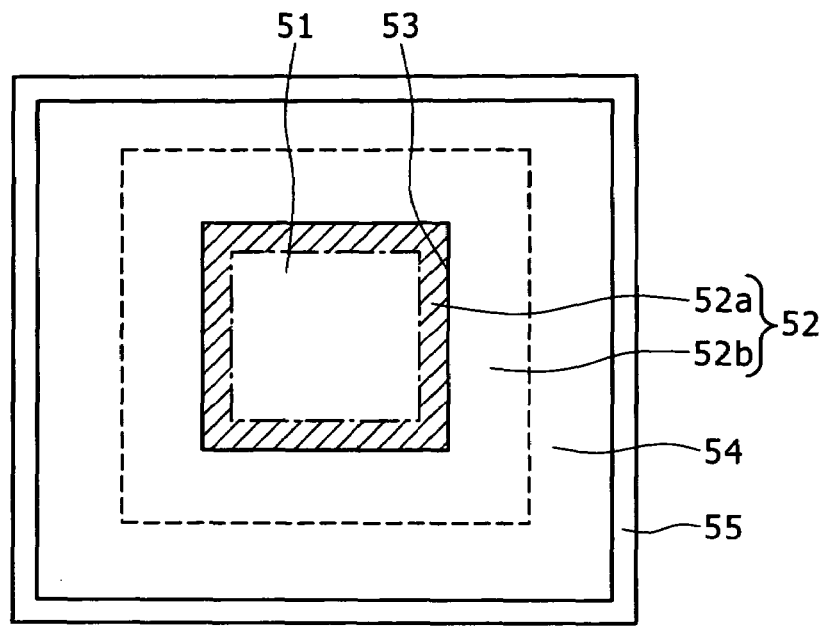
FIGS. 10A and 10B are plan views of part of conventional printed wiring boards.
Figure 10B:
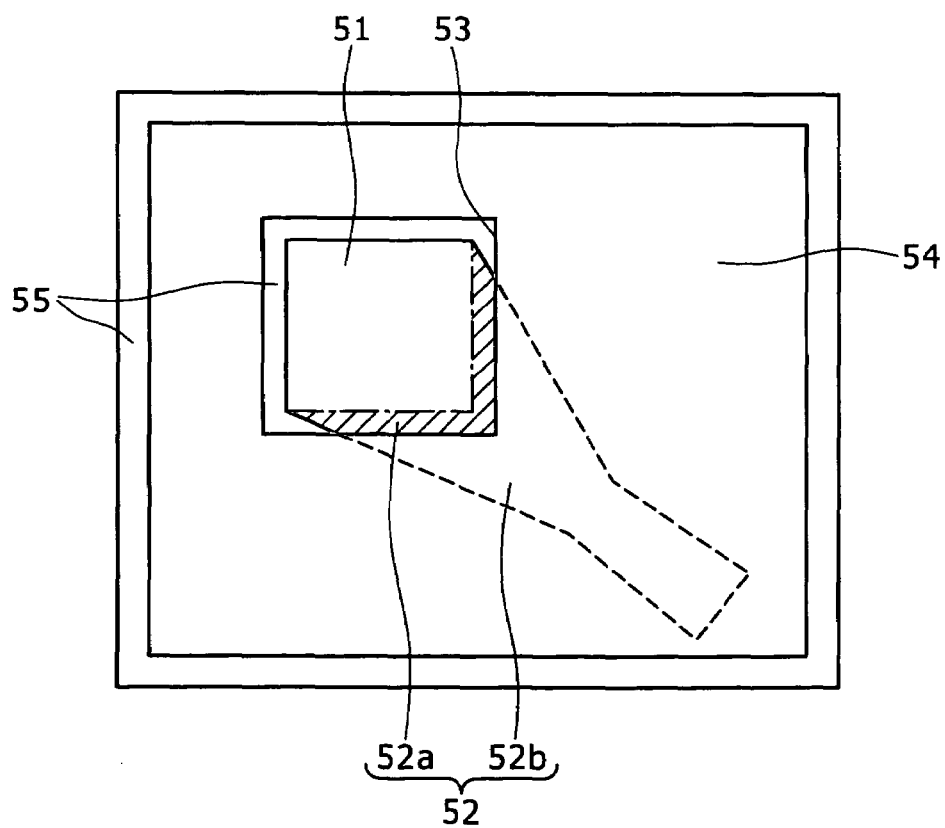

A conductor pattern of a further printed wiring board to which the present invention is applied is shown in plan in FIG. 8.

Referring to FIG. 8, the printed wiring board shown has a configuration similar to that of the printed wiring board described hereinabove with reference to FIG. 1 except the following point.

In particular, in the printed wiring board shown in FIG. 8, each of the wiring line connection elements 2 has only the portion 2A on the side on which the soldering lands 1 are opposed to each other.

Further, a wiring line 6 is connected to a lower end in FIG. 8 of each of the wiring line connection elements 2 (2A).

Also with the printed wiring board having the configuration described above, even if displacement occurs with the pattern of the solder resist 4, this can be prevented from having an influence on the soldering state of a mounted part similarly as in the printed wiring boards of the embodiments described above. Therefore, the pattern of the solder resist 4 can be formed by a printing method thereby to reduce the production cost of the printed wiring board significantly.

Further, where the printed wiring board of the present embodiment is compared with those of the embodiments described hereinabove with reference to FIGS. 1 and 7, the area occupied by the wiring line connection elements 2 is reduced. Therefore, the printed wiring board of the present embodiment is suitably applied where a large number of mounted parts of a small size are mounted on the same printed wiring board to assure a high mounting density.

It is to be noted that the wiring line 6 may alternatively be connected to an upper end of each of the wiring line connection elements 2 (2A) in FIG. 8.

While, in the printed wiring boards of the embodiments described hereinabove, one soldering land 1 is provided for each of electrodes of a mounted part and hence a pair of soldering lands 1 are provided one mounted part, it is possible to otherwise provide more than two electrodes for a mounted part. For example, each of the soldering lands 1 may be divided into a plurality of portions so that more than two soldering lands 1 are provided for a mounted part.

Where each of the soldering lands 1 is divided in this manner, action of the surface tension of molten solder upon a mounted part is divided thereby to achieve an effect of preventing rise or displacement of the mounted part similarly to a configuration proposed formerly by the assignee of the present patent application and disclosed in Japanese Patent Laid-Open No. Hei 10-22617. In the document just mentioned, a configuration is disclosed wherein slits are formed on a soldering land to divide the soldering land.

However, where a conductor pattern is formed by a printing method, if a very fine pattern is formed, then this is influenced by displacement in printing. Therefore, it is necessary to set the width of the slits taking such displacement in printing into consideration. Further, where the displacement in printing is taken into consideration, it is difficult to increase the divisional number very much.

Further, while, in the printed wiring boards of the embodiments described above, the shape of the soldering lands 1 is a quadrangular shape, it may be any of shapes which are used popularly such as a polygon other than the quadrangle or a circular shape.

Further, while, in the printed wiring boards of the embodiments described above, the solder resist 4 is used as an insulating material which covers the conductor patterns, any other insulating material may be used only if a film can be formed from the material by applying or printing and then hardening the material.

While a preferred embodiment of the present invention has been described using specific terms, such description is for illustrative purpose only, and it is to be understood that changes and variations may be made without departing from the spirit or scope of the following claims.

The invention claimed is:

1. A printed wiring board, comprising:
   a substrate;
   a pair of pads formed on the substrate, the pads being spaded from one another with a first side of one pad opposing a first side of another pad;
   a mounted part having a pair of electrodes on opposite ends thereof, each electrode being soldered to a respective one of the pads;
   a plurality of wiring lines each respectively connected to one of the pads;
   an insulating element configured to overlie the wiring lines, the insulating element having openings formed therein such that the pads are exposed through the openings; and
   a pair of wiring line connection elements, each wiring line connection element having a plurality of portions arranged such that only one portion is connected to the first side of one of the pads and such that the other portion or portions are spaced away from each side of the respective pad;
   each of the openings having an edge positioned, except for the first sides of the pads, outside of the corresponding pad and on an inner side of the corresponding wiring line connection element.

2. The printed wiring board according to claim 1, wherein each of the wiring line connection elements surrounds the corresponding pad.

3. The printed wiring board according to claim 1, wherein each of the pads is formed in a substantially framework shape, and each of the wiring line connection elements is formed in a substantially framework shape which surrounds the corresponding pad.

4. The printed wiring board according to claim 1, wherein each of the wiring line connection elements is formed in a substantially channel shape.

5. A fabrication method for a printed wiring board which includes a substrate, a pair of pads formed on the substrate, the pads being spaced from one another with a first side of one pad opposing a first side of another pad, a mounted part having a pair of electrodes on opposite ends thereof, each electrode being soldered to a respective one of the pads, a plurality of wiring lines each respectively connected to one of the pads, and an insulating element configured to overlie the wiring lines, the insulating element having openings formed therein such that the pads are exposed through the openings, the fabrication method comprising:
   forming the pads and the wiring lines on the substrate;
   forming wiring line connection elements on the substrate to individually interconnect the pads and the wiring lines; and
   forming the insulating element so as to overlie the wiring lines and the wiring line connection elements;
   each wiring line connection element having a plurality of portions arranged such that only one portion is connected to the first side of one of the pads and such that the other portion or portions are spaced away from each side of the respective pad; and
   the insulating element being formed such that each of the openings has an edge positioned, except for the first sides of the pads, outside of the corresponding pad and on an inner side of the corresponding wiring line connection element.

6. The fabrication method for a printed wiring board according to claim 5, wherein the insulating element is formed by a screen printing method.

* * * * *